United States Patent
Cho et al.

[11] Patent Number: 6,066,381
[45] Date of Patent: May 23, 2000

[54] WRITE-ONCE-READ-MANY TYPE OPTICAL DISK AND METHOD FOR FABRICATING THE SAME

[75] Inventors: Byung-Il Cho, Songnam-shi; Hyeong-Chang Hong, Ahsan-shi, both of Rep. of Korea

[73] Assignee: Samsung Electronics Co., Ltd., Suwon, Rep. of Korea

[21] Appl. No.: 09/123,440

[22] Filed: Jul. 28, 1998

[30] Foreign Application Priority Data

Jul. 29, 1997 [KR] Rep. of Korea .................. 97-35696

[51] Int. Cl.$^7$ ...................................................... B32B 3/00
[52] U.S. Cl. ...................... 428/64.1; 428/64.2; 428/64.4; 428/913; 430/270.12; 430/495.1; 430/945; 369/283; 369/288
[58] Field of Search .................................. 428/64.1, 64.2, 428/64.4, 913; 430/270.12, 495.1, 945; 369/283, 288

[56] References Cited

U.S. PATENT DOCUMENTS 5,557,596 9/1996 Gibson et al. ........................ 369/101
5,910,517 6/1999 Woo ...................................... 522/78

FOREIGN PATENT DOCUMENTS 6020330 1/1994 Japan .

*Primary Examiner*—Elizabeth Evans
*Attorney, Agent, or Firm*—Staas & Halsey

[57] ABSTRACT

A write-once-read-many type optical disk and a method for fabricating the same. The write-once optical disk includes a thin Fe—Zr—H recording layer formed on a substrate.

24 Claims, 3 Drawing Sheets

WRITE-ONCE-READ-MANY TYPE OPTICAL DISK AND METHOD FOR FABRICATING THE SAME

BACKGROUND OF THE INVENTION

1. Field of the Invention

The present invention relates to a recording medium, and more particularly, to a write-once-read-many type optical disk.

2. Description of the Related Art

Generally, a recording medium is classified into a semiconductor recording medium, a magnetic recording medium or an optical recording medium. As different types of optical recording media, there are a read-only type which can read data but can not write data, such as a CD-ROM (Compact Disk-Read Only Memory), an overwritable type which can write, erase and read data, and a write-once-read-many type which can write data only once.

As illustrated in FIG. 1, a conventional write-once-read-many type optical disk includes a substrate 2, a recording layer 4 of a thin amorphous $TeO_2$—Te—Pd layer in which data is recorded, an adhesive layer 6 and a substrate 8 formed on the adhesive layer 6. Such a write-once-read-many type optical disk is disclosed in SPIE Vol. 1499, Optical Data Storage, pp. 187–194, 1991, Shunji Ohara et al., Matsushita Electric Industrial Co., Ltd.

In operation, since the recording layer 4 is in an amorphous state before data is recorded, it has a low reflectance. If a laser beam is irradiated on the disk for recording, the recording layer 4 of the amorphous state is heated. Thereafter, the recording layer 4 gradually cools down and is crystallized. Under the crystallized state, the reflectance of the recording layer 4 is increased by 7–9%. This means that data is recorded. That is, since there is a difference between the reflectances prior to and after irradiation of the laser beam on the disk, data can be accurately read.

However, the recording layer 4 which is the thin amorphous $TeO_2$—Te—Pd layer has disadvantages as described below. First, during recording, a laser recording power is high (12–13 mW). Therefore, in order to raise a recording density, a shortwave laser should be used. However, the power of the shortwave laser is very low industrially. Second, the difference in the reflectance between an initial non-data recording state and an after-data recording state is low. Third, since a melting point of the thin amorphous $TeO_2$—Te—Pd layer is low (about 600° C.), the amorphous $TeO_2$—Te—Pd layer shows a growing tendency toward crystallization with the lapse of use over time and thus the storage lifetime of the recorded data is short. Fourth, elements Te and Pd used for the recording layer 4 are expensive. Fifth, the element Te is bad for the human body.

SUMMARY OF THE INVENTION

It is therefore an object of the present invention to provide an improved write-once-read-many type optical disk and a method for fabricating the same.

It is another object of the present invention to provide a write-once-read-many type optical disk and a method for fabricating the same from which accurately recorded data can be read and requiring only a low laser power during recording.

It is still another object of the present invention to provide a write-once-read-many type optical disk and a method for fabricating the same which lengthens the storage lifetime of recorded data and lowers the disk fabricating cost.

It is still yet another object of the present invention to provide a write-once-read-many type optical disk and a method for fabricating the same which are not injurious to the human body.

Additional objects and advantages of the invention will be set forth in part in the description which follows and, in part, will be obvious from the description, or may be learned by practice of the invention.

The foregoing objects of the present invention are achieved by providing a write-once-read-many type optical disk which includes a thin Fe—Zr—H recording layer formed on a substrate.

The above objects of the present invention may also be achieved by providing a method for fabricating a write-once-read-many type optical disk which includes the steps of vacuum-depositing a thin Fe—Zr layer on an optical disk substrate by a sputtering method, injecting hydrogen into the thin Fe—Zr layer to form the Fe—Zr—H layer of a non-data state of low reflectance, and effusing the hydrogen from a prescribed portion of the substrate in which data is to be recorded by using a laser beam to form the Fe—Zr layer of a data recording state of high reflectance.

BRIEF DESCRIPTION OF THE DRAWINGS

The above and other objects, features and advantages of the present invention will become more apparent from the following detailed description when taken in conjunction with the accompanying drawings of which.

DETAILED DESCRIPTION OF THE PREFERRED EMBODIMENT

Figure 1:
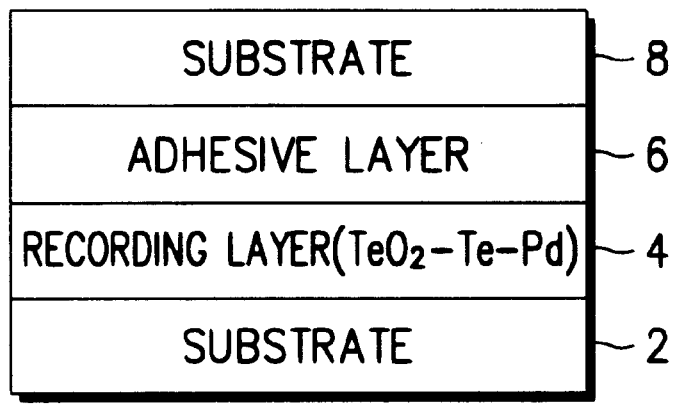
FIG. 1 illustrates a structure of a conventional write-once-read-many type optical disk.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

In the following description, well known functions and constructions which may obscure the present invention in unnecessary detail are not described in detail.

Figure 2:
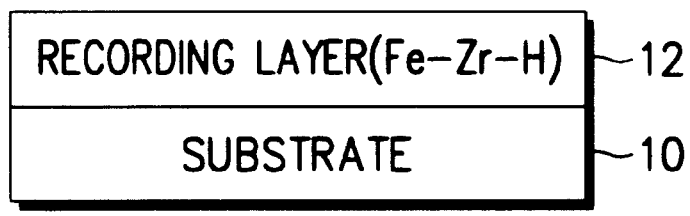
FIG. 2 illustrates a structure of a write-once-read-many type optical disk according to an embodiment of the present invention.

Referring to FIG. 2, a write-once-read-many type optical disk according to an embodiment of the present invention includes a substrate 10 and a recording layer 12 in which data is recorded. The recording layer 12 is an Fe—Zr—H layer of $(Fe_{100-x}Zr_x)_{100-y}H_y$ (where $50 \leq x \leq 93$, $10 \leq y \leq 15$) having a thickness between 200 Å and 500 Å, preferably about 300Å, and is vacuum-deposited by a sputtering method.

Figure 3:
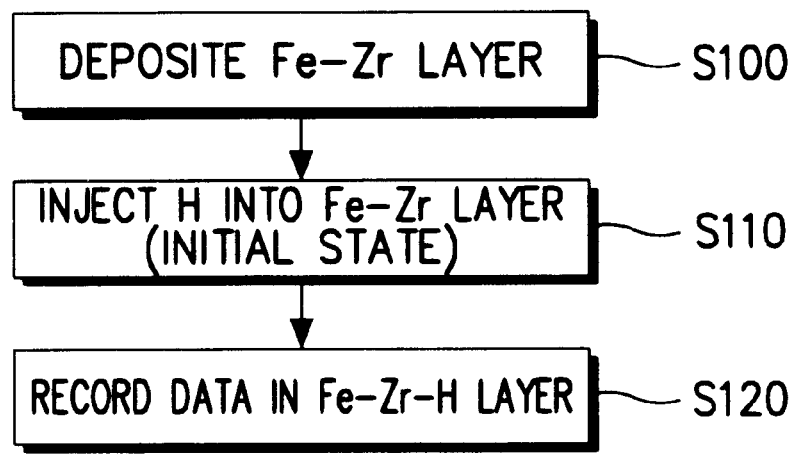
FIG. 3 illustrates a write-once-read-many type optical disk fabricating method according to the embodiment of the present invention.

A fabricating method for the write-once-read-many type optical disk will now be described with reference to FIGS. 2 and 3.

An Fe—Zr layer is vacuum-deposited on the substrate 10 to the thickness between 200 Å and 500 Å (preferably about 300 Å) by the sputtering method in step S100. An atomic percentage value of Zr is 50–93% and Fe occupies the remaining atomic percentage value. Therefore, the thin Fe—Zr layer of an amorphous alloy layer is formed on the substrate 10. Hydrogen (H) is injected into the thin Fe—Zr layer (initial state) in step S110 to form the Fe—Zr—H layer of $(Fe_{100-x}Zr_x)_{100-y}H_y$ (where $50 \leq x \leq 93$, $10 \leq y \leq 15$). In more detail, both the Fe—Zr layer and the graphite are placed into an $H_2S$ solution. The $H_2S$ solution is divided into $H^+$ and $S^{2-}$ by electrolysis. $H^+$ is pulled by the Fe—Zr layer corresponding to a negative electrode and $S^{2-}$ is pulled by the graphite corresponding to the positive electrode. If the thin Fe—Zr layer and graphite are placed in a 0.5-mol $H_2S$ solution and a current of 500–900 $mA/cm^2$ is applied, the hydrogen is pulled by the Fe—Zr layer corresponding to a negative electrode and the $S^{2-}$ is pulled by the graphite corresponding to the positive electrode, the hydrogen of 10–15 atomic percent is injected within about 1–10 minutes. This is because Zr has a property of absorbing the hydrogen. Since the Fe—Zr is amorphous, more hydrogen atoms are injected than in a crystallized state. If the hydrogen is injected, the metal luster, that is, the reflectance of the recording layer 12 is decreased more than in the state that the hydrogen is not injected. If the hydrogen is injected, the recording layer 12 of the low reflectance becomes an initialization state of a non-data recording state.

Figure 4:
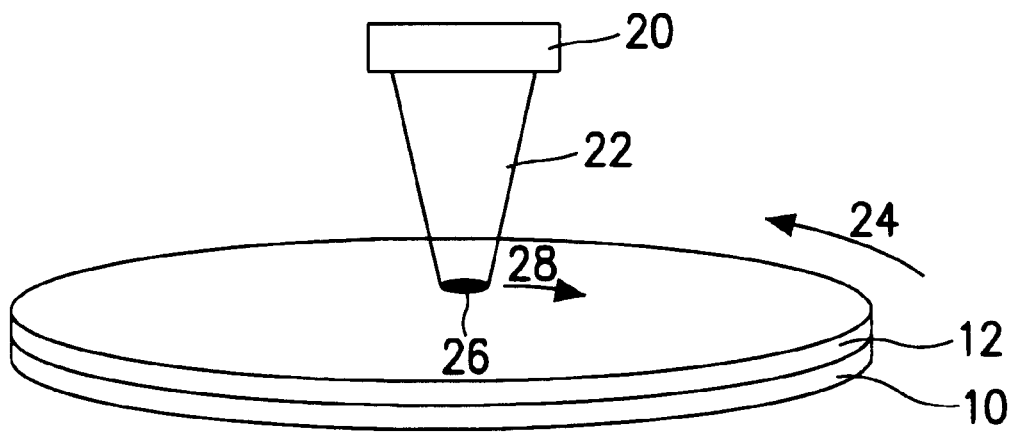
FIG. 4 is a diagram for describing a process that a multilayer of a disk is instantaneously heated by a pulse laser source according to the embodiment of the present invention.

Data is then recorded in the Fe—Zr layer into which the hydrogen has been injected. That is, data is recorded in the amorphous Fe—Zr—H recording layer 12. FIG. 4 shows the process that a multilayer of a disk is instantaneously heated by a pulse laser source. A reference numeral 20 designates a laser source and 22 represents a pulse laser beam produced from the laser source 20. An arrow 24 indicates the rotating direction of the disk when the disk is rotated by a spindle motor of an initialization device. A reference numeral 26 designates a laser beam spot when the laser beam 22 is irradiated on the Fe—Zr—H recording layer 12. An arrow 28 indicates the rotating direction of the beam spot 26. Although the beam spot 26 is in a stopped state, since the disk is rotated, the rotating direction 28 of the beam spot 26 is opposite to the rotating direction 24 of the disk. A reference numeral 10 indicates the substrate.

The process of recording data in the Fe—Zr—H recording layer 12 will now be described with reference to FIGS. 3 and 4. If the pulse laser beam 22 is irradiated and thus the beam spot 26 is formed on the recording layer 12, the temperature of the recording layer 12 is raised. If the temperature of the recording layer 12 becomes about 200° C., a bond between the hydrogen atom and Zr is cut. Further, since the hydrogen has the smallest atomic number in a periodic table, it easily effuses from atoms constituting an Fe—Zr matrix. If the hydrogen effuses, the recording layer 12 becomes an amorphous Fe—Zr layer with high reflectance. Thus, the data is recorded in the recording layer 12 in step S120.

Figure 5:
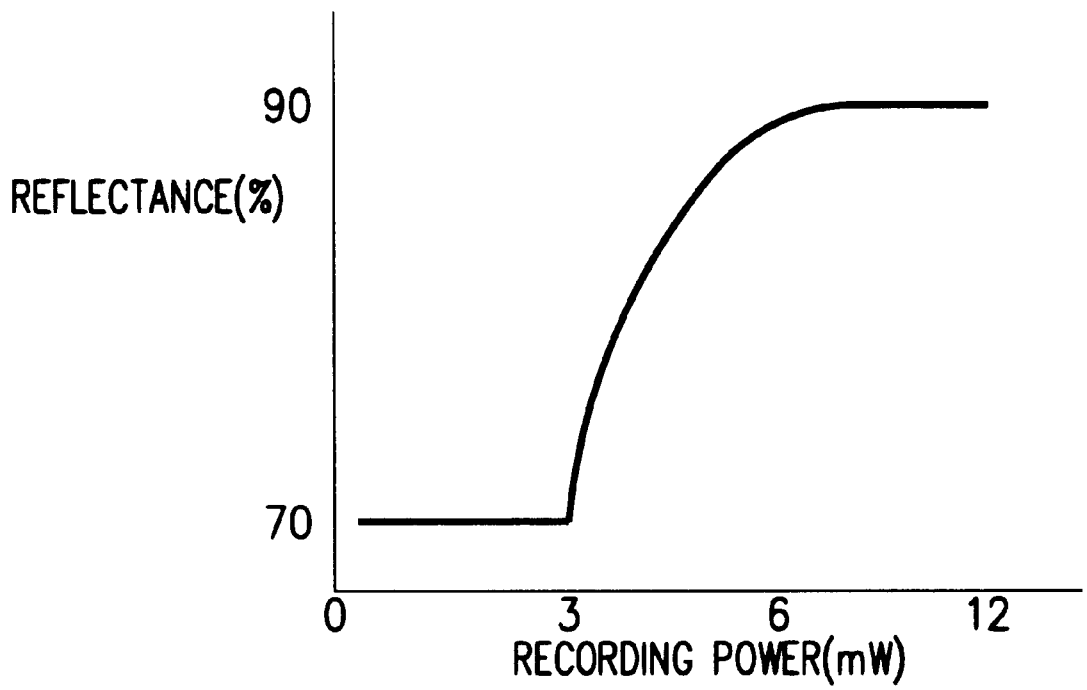
FIG. 5 is a graph illustrating reflectance for a recording power of an Fe—Zr—H disk when a pulse laser is irradiated according to the embodiment of the present invention.

FIG. 5 illustrates the reflectance for the recording power of the Fe—Zr—H disk when the pulse laser beam is irradiated. Referring to FIG. 5, the difference in the reflectance before and after the data is recorded is almost 20%. Namely, the reflectance before recording is 70%, whereas the reflectance after recording is 90%. The recording power required is about 6 mW, in comparison with 12–13 mW required for the conventional write-once-read-many type optical disk.

As described above, the recording layer of the optical disk according to the present invention has the following advantages. First, since the difference in the reflectance before and after the data is recorded is about 20%, the recorded data can be accurately read. Second, during recording, the laser power is low (about 6 mW). Third, since the melting point is above 1500° C., material is stably recorded and the storage lifetime of the data is lengthened. Fourth, since Fe and Zr are low in cost, the manufacturing cost is saved. Fifth, Fe and Zr are not injurious to the human body.

While the invention has been shown and described with reference to a specific preferred embodiment thereof, it will be understood by those skilled in the art that various changes in form and details may be made therein without departing from the spirit and scope of the invention as defined by the appended claims.

What is claimed is:

1. A write-once-read-many type optical disk, comprising:
a substrate; and
an Fe—Zr—H recording layer formed on said substrate.

2. The write-once-read-many type optical disk as claimed in claim 1, wherein said Fe—Zr—H recording layer has a thickness of about 300 Å.

3. The write-once-read-many type optical disk as claimed in claim 2, wherein said Fe—Zr—H recording layer is vacuum-deposited by a sputtering method.

4. The write-once-read-many type optical disk as claimed in claim 3, wherein said Fe—Zr—H layer has an atomic percentage of Zr of 50–93% and a remaining atomic percentage occupied by Fe, prior to an addition of the H.

5. The write-once-read-many type optical disk as claimed in claim 1, wherein said Fe—Zr—H recording layer has a thickness between 200 Å and 500 Å.

6. The write-once-read-many type optical disk as claimed in claim 5, wherein said Fe—Zr—H layer is a layer of $(Fe_{100-x}Zr_x)_{100-y}H_y$ (where $50 \leq x \leq 93$, $10 \leq y \leq 15$).

7. A method of fabricating a write-once-read-many type optical disk, comprising the steps of:
vacuum-depositing an Fe—Zr layer on an optical disk substrate by a sputtering method;
injecting hydrogen into said Fe—Zr layer to form an Fe—Zr—H layer of a non-data state of low reflectance; and
effusing said hydrogen from prescribed portions of said substrate in which data is to be recorded using a laser beam to form an Fe—Zr layer of a data recording state of high reflectance.

8. The method as claimed in claim 7, wherein said Fe—Zr—H layer of the data recording state has a thickness of about 300 Å.

9. The method as claimed in claim 8, wherein said Fe—Zr layer has an atomic percentage of Zr of 50–93% and a remaining atomic percentage occupied by Fe.

10. The method as claimed in claim 7, wherein said Fe—Zr—H layer of the data recording state has a thickness between 200 Å and 500 Å.

11. The method as claimed in claim 10, wherein said Fe—Zr—H layer of the non-data state is a layer of $(Fe_{100-x}Zr_x)_{100-y}H_y$ (where $50 \leq x \leq 93$, $10 \leq y \leq 15$).

12. The method as claimed in claim 7, wherein said step of injecting hydrogen comprises the steps of:
placing said Fe—Zr layer and graphite into a 0.5-mol H2S solution; and
applying a current of 500–900 $mA/cm^2$ to said 0.5-mol $H_2S$ solution including said Fe—Zr layer and said graphite so that H+ is pulled by said Fe—Zr layer corresponding to a negative electrode and $S^{2-}$ is pulled by said graphite corresponding to a positive electrode.

13. The method as claimed in claim 7, wherein said step of effusing said hydrogen comprises the step of forming a spot using said laser beam on said Fe—Zr—H layer of the non-data state to increase a temperature of said Fe—Zr—H layer of the non-data state to at least 200° C.

14. A write-once-read-many type optical disk to store data, comprising:

a substrate; and an Fe—Zr—H recording layer formed on said substrate and in which the data is stored.

15. The write-once-read-many type optical disk as claimed in claim 14, wherein said Fe—Zr—H recording layer has a melting point above 1500° C.

16. A method of fabricating a write-once-read-many type optical disk, comprising the steps of:

forming an Fe—Zr layer on a substrate;

injecting hydrogen into the Fe—Zr layer, to form an Fe—Zr—H layer of a non-data state of a first reflectance; and effusing the hydrogen from designated regions of said Fe—Zr—H layer of the non-data state, to form an Fe—Zr layer of a data recording state having a second reflectance greater than the first reflectance.

17. The method of fabricating a write-once read-many type optical disk as claimed in claim 16, wherein said step of forming an Fe—Z layer comprises the step of vacuum depositing the Fe—Zr layer on the substrate, an atomic percentage value of the Zr is 50–93% and an atomic percentage value of the Fe is a remaining percentage value.

18. The method of fabricating a write-once read-many type optical disk as claimed in claim 17, wherein said step of injecting hydrogen comprises the steps of:

placing the Fe—Zr layer and graphite in a 0.5 mol $H_2S$ solution;

applying a current of 500–900 $mA/cm^2$ to the $H_2S$ solution with the Fe—Zr layer and the graphite; and injecting the hydrogen, of 10–15% atomic percent, into the Fe—Zr layer, to form the Fe—Zr—H layer of the non-data state.

19. The method of fabricating a write-once read-many type optical disk as claimed in claim 18, wherein said step of injecting hydrogen, of 10–15% atomic percent, into the Fe—Zr layer comprises the step of injecting the hydrogen into the Fe—Zr layer within 1–10 minutes.

20. The method of fabricating a write-once read-many type optical disk as claimed in claim 16, wherein a difference in percentages of the second reflectance and the first reflectance is approximately 20%.

21. The method of fabricating a write-once read-many type optical disk as claimed in claim 20, wherein the first reflectance is approximately 70% and the second reflectance is approximately 90%.

22. The method of fabricating a write-once read-many type optical disk as claimed in claim 16, wherein said step of effusing the hydrogen from designated regions of said FeZr—H layer of the non-data state comprises the steps of:

rotating the optical disk having the Fe—Zr—H layer of the non-data state formed on the substrate; and irradiating a laser beam on the Fe—Zr—H layer of the non-data state while the optical disk having the Fe—Zr—H layer of the non-data state formed on the substrate is rotated, to increase temperatures of the designated regions, thereby effusing the hydrogen from the designated regions, and thereby forming the Fe—Zr layer of the data recording state.

23. The method of fabricating a write-once read-many type optical disk as claimed in claim 22, wherein said step of irradiating a laser beam increases the temperatures of the designated regions to at least 200° C.

24. The method of fabricating a write-once read-many type optical disk as claimed in claim 18, wherein said step of effusing the hydrogen from designated regions of said FeZr—H layer of the non-data state comprises the steps of:

rotating the optical disk having the Fe—Zr—H layer of the non-data state formed on the substrate; and irradiating a laser beam on the Fe—Zr—H layer of the non-data state while the optical disk having the Fe—Zr—H layer of the non-data state formed on the substrate is rotated, to increase temperatures of the designated regions, thereby effusing the hydrogen from the designated regions, and thereby forming the Fe—Zr layer of the data recording state.

* * * * *

UNITED STATES PATENT AND TRADEMARK OFFICE
CERTIFICATE OF CORRECTION

PATENT NO.: 6,066,381
DATED : May 23, 2000
INVENTOR(S): Byung-Il CHO et al.

It is certified that [an/error[s]] appears in the above-identified patent and that said Letters Patent is hereby corrected as shown below:

Column 6, line 14, "FeZr-H" should be --Fe-Zr-H--.

Column 6, line 31, "FeZr-H" should be --Fe-Zr-H--.

Signed and Sealed this

First Day of May, 2001

Attest:

NICHOLAS P. GODICI

*Attesting Officer*   *Acting Director of the United States Patent and Trademark Office*